(12) United States Patent
Howard et al.

(10) Patent No.: US 8,502,561 B2
(45) Date of Patent: Aug. 6, 2013

(54) SIGNAL VALUE STORAGE CIRCUITRY WITH TRANSITION DETECTOR

(75) Inventors: David William Howard, Cambridge (GB); David Michael Bull, Cambridge (GB); Shidhartha Das, Norwich (GB)

(73) Assignee: ARM Limited, Cambridge (GB)

( * ) Notice: Subject to any disclaimer, the term of this patent is extended or adjusted under 35 U.S.C. 154(b) by 23 days.

(21) Appl. No.: 13/067,886

(22) Filed: Jul. 1, 2011

(65) Prior Publication Data

US 2013/0002298 A1  Jan. 3, 2013

(51) Int. Cl.
*H03K 19/00* (2006.01)
*H03K 19/007* (2006.01)

(52) U.S. Cl.
USPC ............ 326/93; 326/14; 326/46; 327/202; 327/218

(58) Field of Classification Search
USPC .................. 326/9–16; 327/199–218
See application file for complete search history.

(56) References Cited

U.S. PATENT DOCUMENTS

| 6,429,713 B2 * | 8/2002 | Nakaizumi | 327/218 |
|---|---|---|---|
| 2003/0030474 A1 * | 2/2003 | McGowan | 327/202 |
| 2007/0162798 A1 | 7/2007 | Das et al. | |
| 2007/0168848 A1 * | 7/2007 | Tschanz et al. | 714/798 |

OTHER PUBLICATIONS

Blaauw et al., "Razor II: In Situ Error Detection and Correction for PVT and SER Tolerance", *2008 IEEE International Solid-State Circuits Conference*, 2008, 3 pages.
Bowman et al., "Energy-Efficient and Metastability-Immune Timing-Error Detection and Instruction-Replay-Based Recovery Circuits for Dynamic-Variation Tolerance", *2008 IEEE Solid-States Circuits Conference*, 2008, 3 pages.
Bull et al., "A Power-Efficient 32 bit ARM Processor Using Timing-Error Detection and Correction for Transient-Error Tolerance and Adaptation to PVT Variation", *IEEE Journal of Sold-State Circuits*, vol. 46, No. 1, Jan. 2011, pp. 18-31.
Tschanz et al., "A 45nm Resilient and Adaptive MicroProcessor Core for Dynamic Variation Tolerance", *2010 IEEE International Sold-State Circuits Conference*, 2010, pp. 282-284.

* cited by examiner

*Primary Examiner* — Jany Richardson
(74) *Attorney, Agent, or Firm* — Nixon & Vanderhye P.C.

(57) ABSTRACT

A D-type flip-flop includes tristate inverter circuitry passing a processing signal through to storage circuitry 8 from where the processing signal passes via a transmission gate to slave storage circuitry. A transition detector is coupled to the input node of the storage circuitry and serves to generate an error signal if a transition is detected upon that input node during an error detecting period. Other forms of this technique may provide clock gating circuitry.

20 Claims, 10 Drawing Sheets

SIGNAL VALUE STORAGE CIRCUITRY WITH TRANSITION DETECTOR

TECHNICAL FIELD

This invention relates to the field of data processing systems. More particularly, this invention relates to signal value storage circuitry including a transition detector.

BACKGROUND

It is known to provide signal value storage circuitry, such as D-type flip-flops (DFF), for use in storing signal values, such as signal values representing binary values. Such signal value storage circuitry may be used in many different places within a data processing system, such as for storing data values to be processed, control values for controlling such processing, program instructions to control processing and the like.

It is known from WO-A-2004/084072 to provide a data processing system which is configured to operate at a finite non-zero error rate and includes error detection and recovery mechanisms. In this way, the operating frequency can be increased and/or the operating voltage reduced to a point at which errors occur, but that the overhead associated with recovering from those errors is less than the gain achieved by operating at the higher frequencies and/or lower voltages.

Within such systems it is known to provide DFFs which incorporate a transition detector on the data input and utilise a pulse generator or a clock chopping device to define an error detection window around an edge of the clock signal controlling the DFF. If a transition occurs in the input signal to the DFF after the signal has been captured into the DFF and during the error detection period, then this indicates a late arriving signal at the DFF and corresponds to an error that should trigger an error recovery operation.

A problem with this type of DFF is that the transition detector monitors the input of the master latch to observe the late arriving signal. To ensure a late input transition is successfully identified, there needs to be some margin between the set-up time that is used to flag such a late input transition and the minimum permitted set-up time of the DFF itself. Although it is desirable to keep this margin small to reduce the set-up time, it is important that the system detects set-up violations across the entire permitted range of process, temperature, operating voltage and the like. This margin adds directly to the characterised set-up time of the device, because under normal operating circumstances the condition is not expected to encounter any late input transitions. Various paths within the DFF employing this technique contribute to the uncertainty in the timing of its operation.

With this background, the increase in random variation in the performance characteristics of such devices as process nodes shrink has the result that yet more margin needs to be added to the timing to guarantee that late arriving signals are properly detected and flagged. All this increase in margin leads to a significant increase in the set up time of a DFF employing these error detection and correction techniques compared to the set up time of the underlying DFF not using such techniques. This is a significant performance penalty.

SUMMARY

Viewed from one aspect the present invention provides signal value storage circuitry comprising:

first signal transmission circuitry having a first processing signal input, a first processing signal output and a first clock signal input, said first signal transmission circuitry being configured to transmit a processing signal received at said first processing signal input to said first processing signal output when a first clock signal received at said first clock signal input has a first open value and to block transmission of said processing signal received at said first processing signal input to said first processing signal output when said first clock signal has a first closed value;

storage circuitry having a storage input and a storage output, said storage input being connected to said first processing signal output and said storage circuitry being configured to capture said processing signal output from said first processing signal output, to store said processing signal when said storage input is not driven and to output said processing signal stored within said storage circuitry from said storage output;

second signal transmission circuitry having a second processing signal input, a second processing signal output and a second clock signal input, said second processing signal input being connected to said storage output and said second signal transmission circuitry being configured to transmit said processing signal received at said second processing signal input to said second processing signal output when a second clock signal received at said second clock signal input has a second open value and to block transmission of said processing signal received at said second processing signal input to said second processing signal output when said second clock signal has a second closed value;

transition detector circuitry having a transition detector input connected to receive said processing signal from one of said storage input and said storage output, said transition detector circuitry being configured to assert an error signal if said processing signal changes during an error detection period.

The present technique provide a signal value storage circuitry, which may, for example, take the form of a DFF, or other signal value storage device, in which the transition detector circuitry is connected to the storage circuitry downstream of the first transmission signal circuitry so as to directly monitor for signal value transitions within the storage circuitry itself that occur during the error detection period. This helps address the set-up time problems discussed above.

The start of the error detection period can vary depending upon the implementation but may be coordinated with the change of the second clock signal that opens the second signal transmission circuitry, e.g. has a predetermined offset from this change.

The end of the error detection period can also vary depending upon the implementation but will be coordinated with the change of the first clock signal that closes the first signal transmission circuitry, e.g. is synchronised therewith or has a predetermined offset therefrom.

The control of the signal value storage circuitry may be simplified using first delay circuitry which receives the second clock signal and generates the first clock signal as a delayed form of the second clock signal.

In some embodiments second delay circuitry (which may share elements of the first delay circuitry) is configured to receive the second clock signal and to generate an error detection period control signal which is supplied to the transition detecting circuitry and indicates an end time of the error detection period as a delayed form of the second clock signal. This simplifies the control of the transition detector circuitry and helps to reduce uncertainty due to divergence in different clock paths thereby requiring smaller margins and permitting improved set-up times. The design and verification of such circuits is also eased.

The first signal transmission circuitry can have a variety of different forms in which the first clock signal is used to selective pass the processing signal. In some embodiments the first signal transmission circuitry comprises tristate inverter circuitry. Such tristate inverters can drive directly into the storage circuitry improving the speed of operation and providing inherently better set-up times.

The tristate inverter circuitry may be arranged to have a functional signal input, a scan signal input and a scan enable input and be formed as a first tristate inverter configured to pass the functional signal and a second tristate inverter configured to pass the scan signal in dependence upon the first clock signal and the scan enable signal. This provides a scanable form of the signal value storage circuitry, which is well suited for test and debug type operations.

As previously mentioned, the signal value storage circuitry could have a variety of different forms. In one form the signal value storage circuitry may be a master-slave flip flop in which the storage circuitry corresponds to a portion of the master latch and which is further provided with a slave latch downstream of the second signal transmission circuitry.

Another possible form of the signal value storage circuitry is as clock gating circuitry in which the processing signal comprises an enable signal and which further includes a logic gate serving as the second signal transmission circuitry which generates an output clock signal as a logical combination of the processing signal and the second clock signal.

The signal value storage circuitry with transition detector circuitry of the present techniques may be used to detect errors. In some embodiments the signal value storage circuitry may include error correcting circuitry configured to respond to assertion of the error signal to initiate an error correction operation.

The transition detector input may be connected to the storage input or the storage output, but it is preferred to connect to the storage input as this will help timing constraints associated with detecting an inappropriate transition.

The second transmission circuitry may have a variety of different forms. In some embodiments, this second transmission circuitry may comprise a transmission gate controlled by the second clock signal.

The transition detector circuitry may also have a variety of different forms. One form of transition detector circuitry which provides robust transition detection and a resistance to process variation is one comprising:
  first edge detecting circuitry for logically combining said processing signal with a delayed version of said processing signal to generate a first intermediate signal with edges corresponding to a delayed rising edge of said processing signal and a falling edge of said processing signal;
  second edge detecting circuitry for logically combining said processing signal with a delayed version of said processing signal to generate a second intermediate signal with edges corresponding to a rising edge of said processing signal and a delayed falling edge of said processing signal; and
  combination circuitry configured to logically combine said first intermediate signal and said second intermediate signal to generate a transition signal with asserted portions corresponding to detected transitions in said processing circuitry.

Viewed from another aspect the present invention provides signal value storage circuitry comprising:
  first signal transmission means for transmitting a processing signal, said first signal transmission means having a first processing signal input, a first processing signal output and a first clock signal input, said first signal transmission means being configured to transmit said processing signal received at said first processing signal input to said first processing signal output when a first clock signal received at said first clock signal input has a first open value and to block transmission of said processing signal received at said first processing signal input to said first processing signal output when said first clock signal has a first closed value;
  storage means for storing said processing signal, said storage means having a storage input and a storage output, said storage input being connected to said first processing signal output and said storage means being configured to capture said processing signal output from said first processing signal output, to store said processing signal when said storage input is not driven and to output said processing signal stored within said storage means from said storage output;
  second signal transmission means for transmitting said processing signal, said second signal transmission means having a second processing signal input, a second processing signal output and a second clock signal input, said second processing signal input being connected to said storage output and said second signal transmission means being configured to transmit said processing signal received at said second processing signal input to said second processing signal output when a second clock signal received at said second clock signal input has a second open value and to block transmission of said processing signal received at said second processing signal input to said second processing signal output when said second clock signal has a second closed value;
  transition detector means for detecting a transition in said processing signal, said transition detector means having a transition detector input connected to receive said processing signal from one of said storage input and said storage output, said transition detector means being configured to assert an error signal if said processing signal changes during an error detection period.

Viewed from a further aspect the present invention provides a method of operating signal value storage circuitry, said method comprising the steps of:
  a first transmission control step of transmitting a processing signal through first signal transmitting circuitry having a first processing signal input, a first processing signal output and a first clock signal input, said first transmission control step transmitting said processing signal received at said first processing signal input to said first processing signal output when a first clock signal received at said first clock signal input has a first open value and blocking transmission of said processing signal received at said first processing signal input to said first processing signal output when said first clock signal has a first closed value;
  a storing step of storing said processing signal in storage circuitry, said storage circuitry having a storage input and a storage output, said storage input being connected to said first processing signal output and said storing step capturing said processing signal output from said first processing signal output, storing said processing signal when said storage input is not driven and outputting said processing signal stored within said storage circuitry from said storage output;

a second signal transmission control step of transmitting said processing signal through second signal transmitting circuitry having a second processing signal input, a second processing signal output and a second clock signal input, said second processing signal input being connected to said storage output, said second signal transmission control step transmitting said processing signal received at said second processing signal input to said second processing signal output when a second clock signal received at said second clock signal input has a second open value and blocking transmission of said processing signal received at said second processing signal input to said second processing signal output when said second clock signal has a second closed value;

a transition detecting step of detecting a transition in said processing signal using transition detector circuitry having a transition detector input connected to receive said processing signal from one of said storage input and said storage output, said transition detecting steps asserting an error signal if said processing signal changes during an error detection period.

It will also be appreciated that another aspect of the present invention is a standard cell library which is used to control a computer to form layout data for forming an integrated circuit including signal value storage circuitry as previously discussed. Such standard cell library data defines the form of the signal value storage circuitry and is used to drive automated processes and mechanisms used to manufacture a physical instantiation of that signal value storage circuitry.

The above, and other objects, features and advantages of this invention will be apparent from the following detailed description of illustrative embodiments which is to be read in connection with the accompanying drawings.

DESCRIPTION OF NON-LIMITING EXAMPLE EMBODIMENTS

Figure 1:
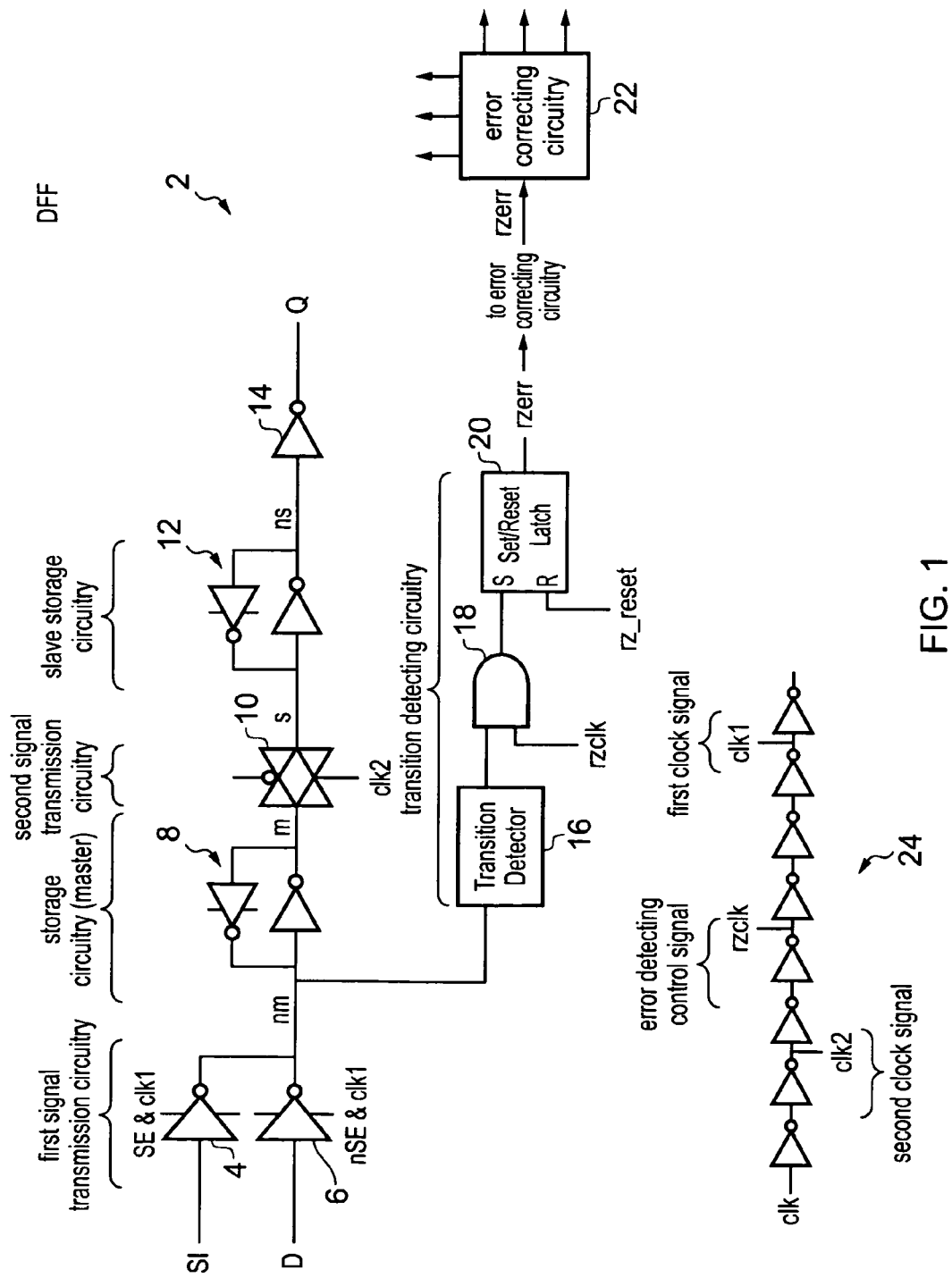
FIG. 1 schematically illustrates a D-type flip-flop circuit including transition detector circuitry for detecting late arriving transitions in the input signal.

FIG. 1 schematically illustrates signal value storage circuitry in the form of a D-type flip flop 2. This includes first signal transmission circuitry in the form of two tristate inverters 4, 6 controlled by a combination of a first clock signal clk1 and a scan enable signal se. Storage circuitry 8 serves as part of a master latch and is formed of a cross-coupled inverter pair (the feedback inverter is a tri-state inverter which is enabled when clk1 is low). Second signal transmission circuitry in the form of a transmission gate 10 is connected to the storage output of the master storage circuitry 8. Slave storage circuitry 12 receives the output from the transmission gate 10 and passes this via an inverter 14 to form the output signal Q from the D-type flip flop 2. The transmission gate 10 is controlled using a second clock signal nclk/bclk.

Transition detector circuitry 16 is connected to the input node nm of the master storage circuitry 8. The transition detector 16 asserts a signal if it detects a transition at the input to the master storage 8. The output from the transition detector 16 is gated by an AND gate 18 with one input formed by an error detecting control signal rzclk to form an error signal rzerr which is stored within a set/reset latch 20 and is output to error correcting circuitry 22. The error correcting circuitry 22 when it receives an error signal rzerr triggers an error correction operation whereby processing based upon an incorrect value of the processing signal which passed the transmission gate 10 before the late arriving signal caused the transition is suppressed, e.g. the system may be reset, a corrected value inserted, or another error correcting action taken. In other embodiments it may be sufficient that the rzerr signal is used to notify the system that an error has occurred and an error correction action may be not be mandatory.

A delay line 24 serves to receive an input clock signal clk and then generate the second clock signal clk2, the error detecting control signal rzclk and the first clock signal clk1 which are output to respective parts of the signal value storage circuitry 2 as indicated in FIG. 1. The error detecting control signal rzclk determines the start of the error detection period. In operation the transition detector circuitry 16 serves to assert an error signal rzerr if the processing signal at the input node nm of the master storage 8 changes its value during an error detection period which starts at a time coordinated with the second clock signal opening the transmission gate 10 and ends when the first clock signal closes the tristate inverters 4, 6 or a time coordinated therewith. The start of the error detection period may have a predetermined offset from the opening of the transmission gate 10, e.g. the start may be a predetermined time before or after the opening or synchronised with the opening.

Figure 2:
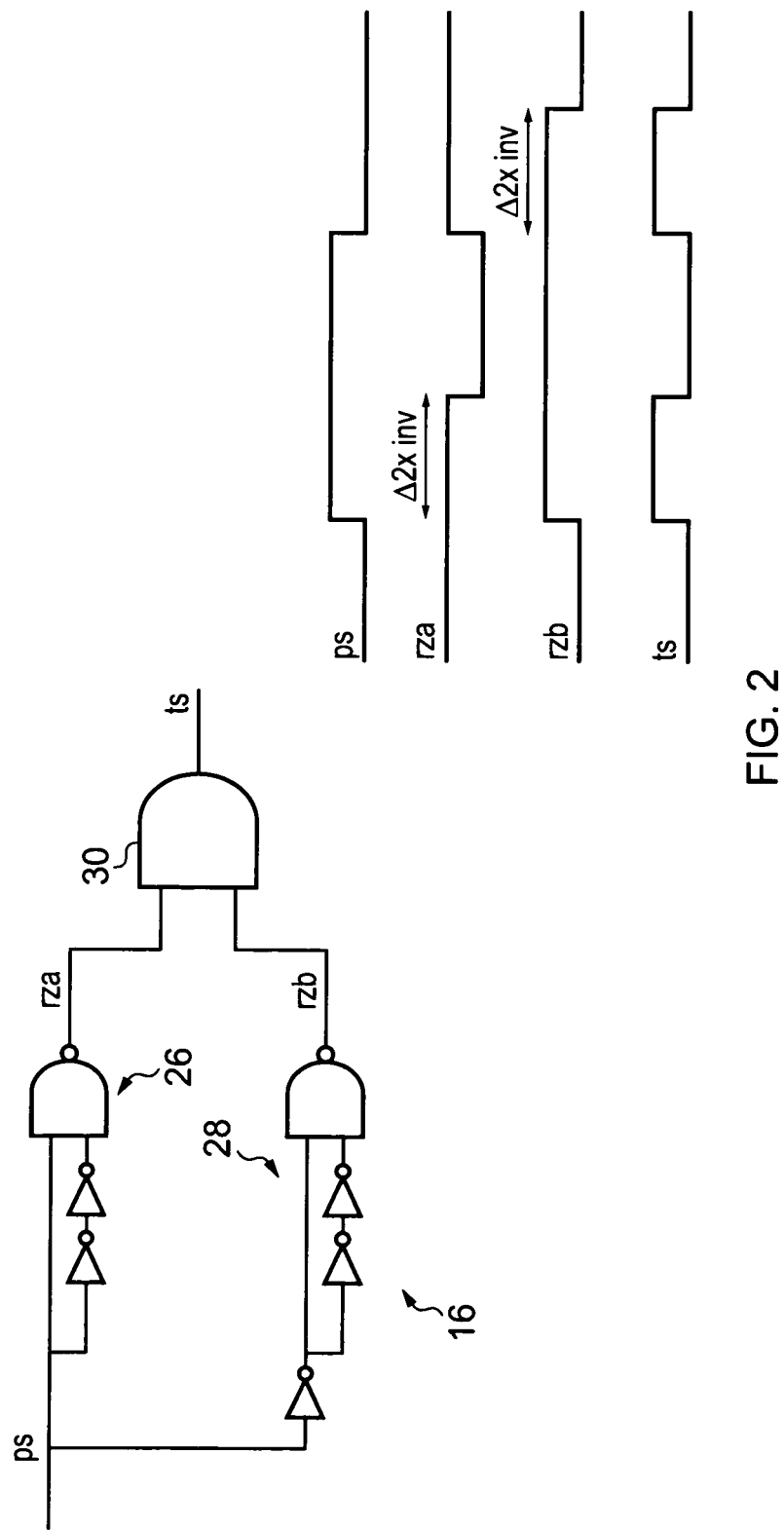
FIG. 2 schematically illustrates more detail of the transition detector circuitry.

FIG. 2 schematically illustrates the transition detector 16 in more detail. The transition detector 16 is formed of first edge detecting circuitry 26 which logically combines the processing signal ps with a delayed version of the processing signal ps to generate a first intermediate signal rza. This first intermediate signal rza has edges corresponding to a delayed rising edge of the processing signal ps and a falling edge of the processing signal ps. Second edge detecting circuitry 28 logically combines the processing signal ps with a delayed version of the processing signal ps to generate a second intermediate signal rzb with edges corresponding to a rising edge of the processing signal ps and a delayed falling edge of the processing signal ps. An AND gate 30 logically combines the first intermediate signal rza and the second intermediate signal rzb to generate a transition signal ts with asserted portions corresponding to detected transitions in the processing signal ps.

The waveforms in the right hand portion of FIG. 2 illustrate the received processing signal ps, the first and second intermediate signals rza, rzb and the transition signal ts. The transition signal ts has asserted portions substantially corresponding in duration to the two inverter delay in each of the first error detecting circuitry 26 and the second error detecting circuitry 28. This transition signal ts is applied as an input to the AND gate 18 of FIG. 1 whose output is in turn captured within the set/reset latch 20 to provide the error signal rzerr which is supplied to the error correcting circuitry 22.

Figure 3:
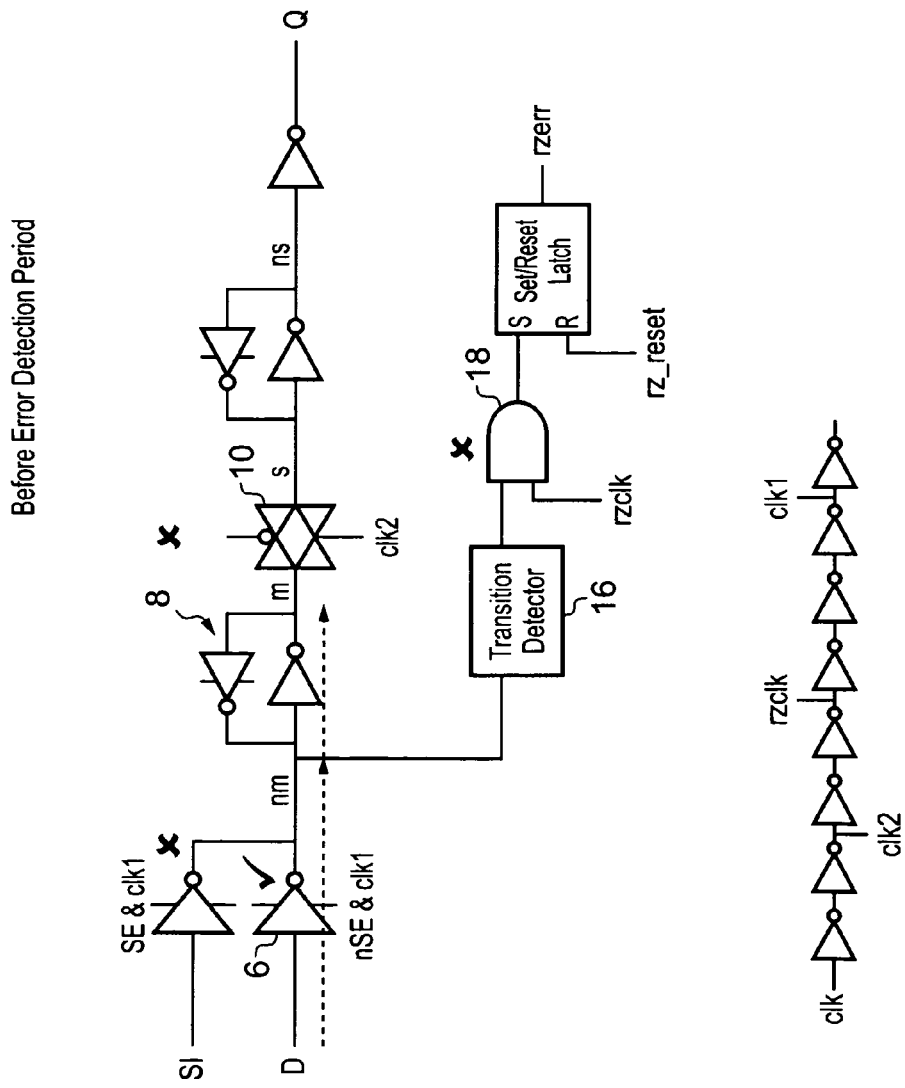
FIG. 3 schematically illustrates the state of the circuit of FIG. 1 before an error detection period.

FIG. 3 schematically illustrates the circuit of FIG. 1 before the start of the error detection period. At this time, the Instate inverter 6 is open and the transmission gate 10 is closed. Accordingly, the input processing signal D can propagate through the master storage circuitry 8 up to the transmission gate 10. At this time, the error detecting control signal rzclk supplied to the AND gate 18 will not pass any output from the transition detector 16.

Figure 4:
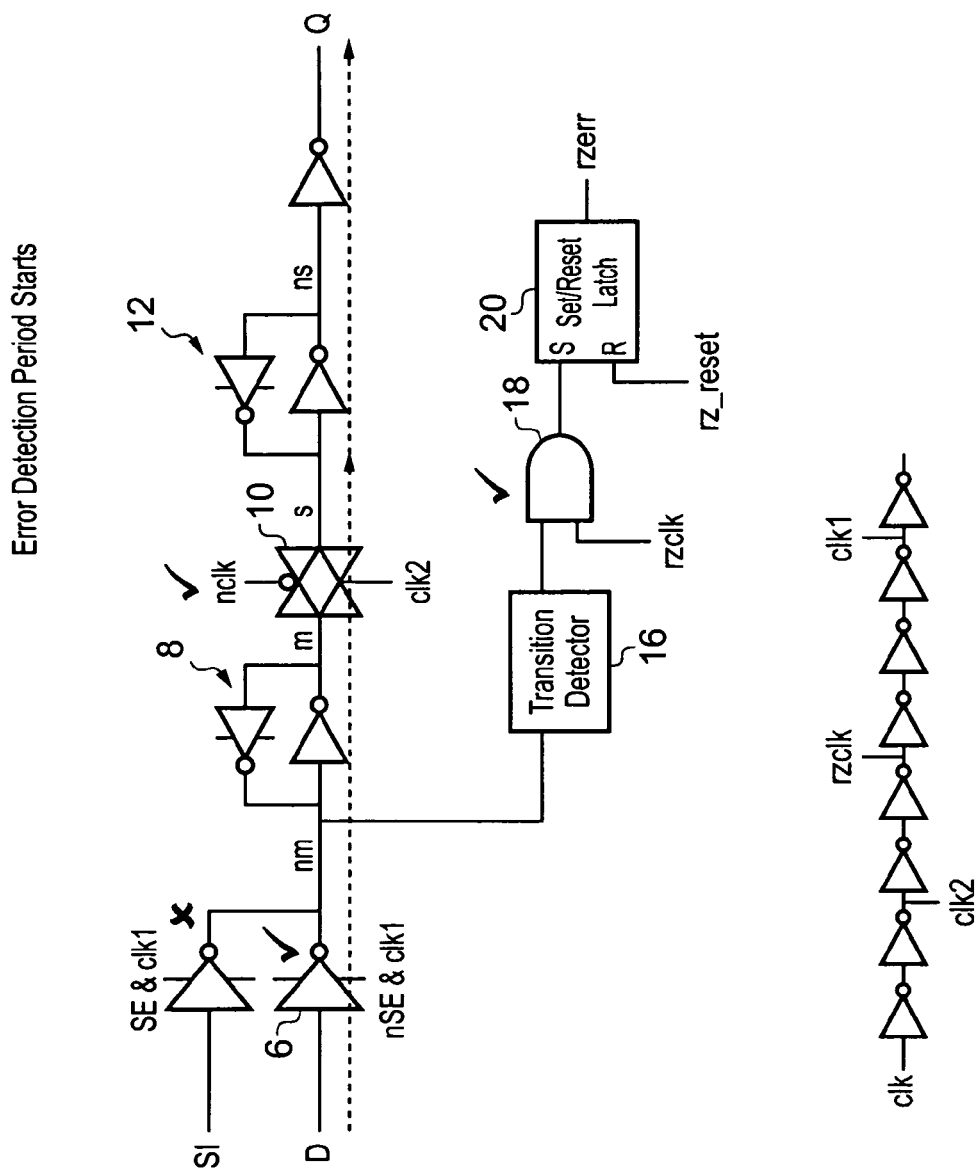
FIG. 4 schematically illustrates the circuit of FIG. 1 at the start of the error detection period.

FIG. 4 schematically illustrates the state of the circuit of FIG. 2 when the error detection period has started. At this time, the tristate inverter 6 remains open and the transmission gate 10 is also open. This has the result that the processing signal D propagates through both the master storage circuitry 8 and the slave storage circuitry 12 to reach the output Q. The AND gate 18 has been enabled by the error detecting control signal rzclk and accordingly the set/reset latch 20 is sensitised to any transition signals is output from the transition detector 16.

Figure 5:
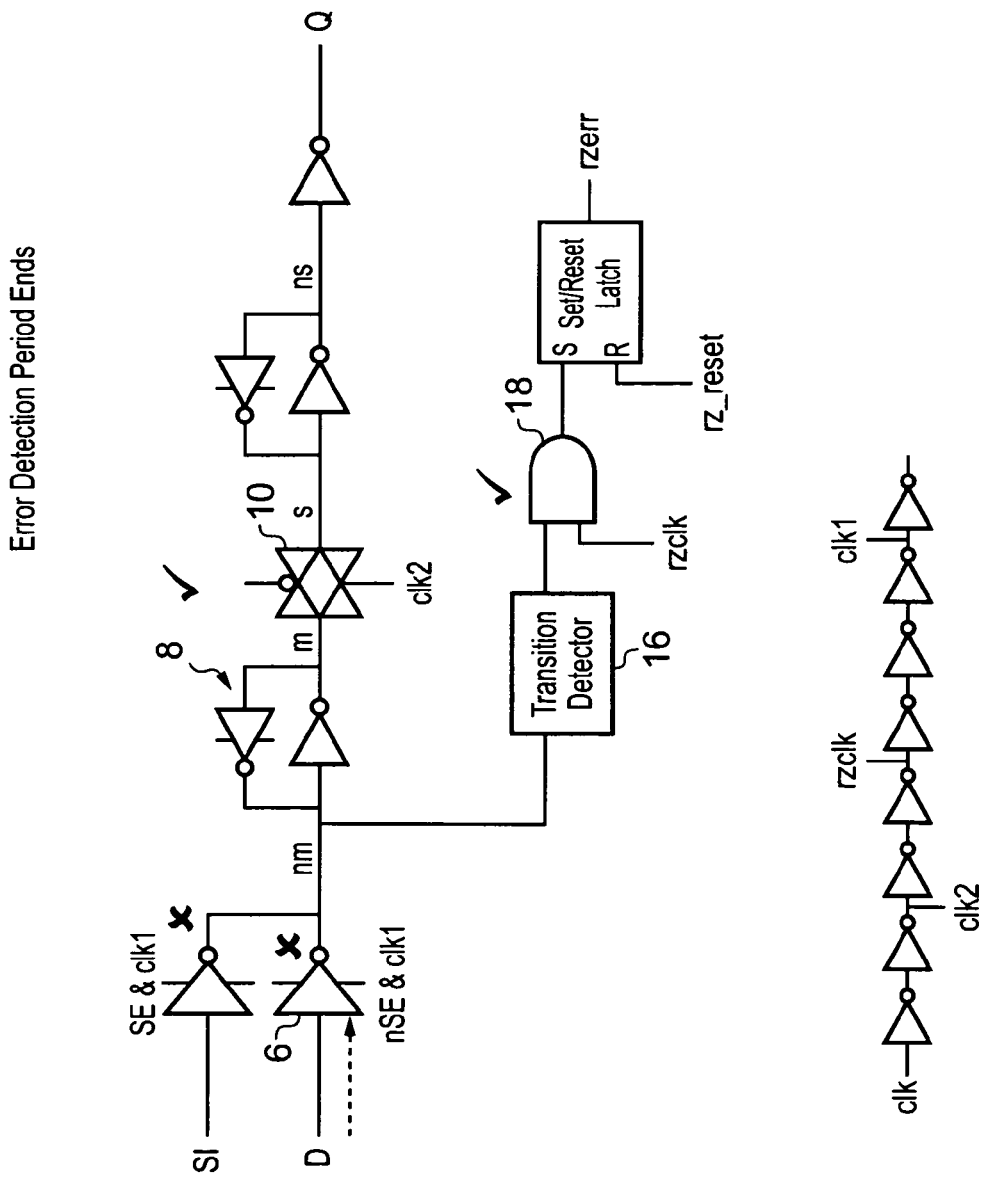
FIG. 5 schematically illustrates the circuit of FIG. 1 at the end of the error detection period.

FIG. 5 schematically illustrates the state of the circuit of FIG. 1 at the end of the error detection period. At this time, the tri-state inverter 6 is closed such that the input processing signal D no longer propagates into the master storage circuitry 8. The transmission gate 10 remains open and the AND gate 18 remains enabled. The closing of the tristate inverter 6 by the first clock signal clk1 has the result that any late arriving transition in the processing signal D will no longer reach the input node nm of the master storage circuitry 8 and accordingly will not be detected by the transition detector 16.

Figure 6:
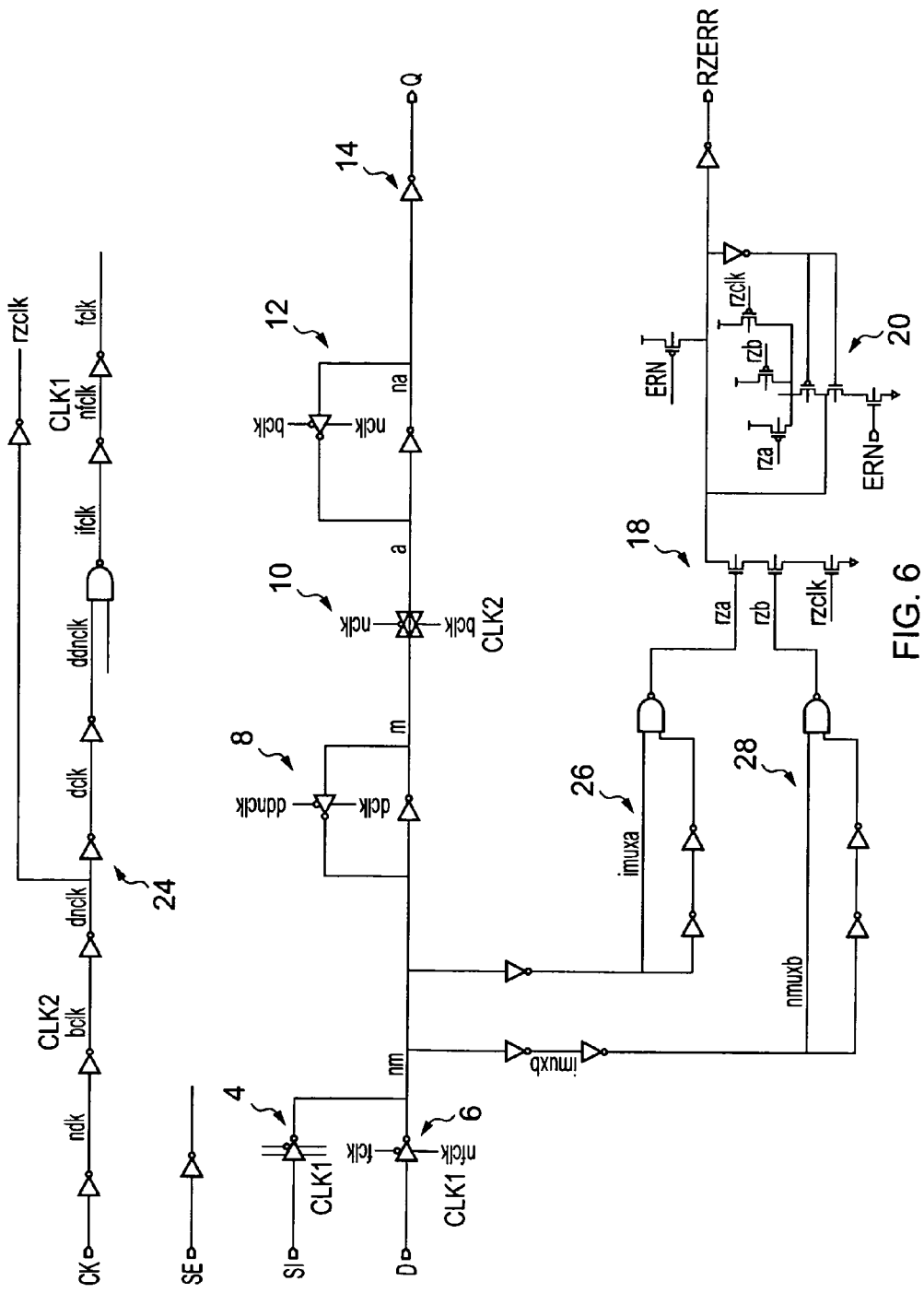
FIG. 6 illustrates the circuit of FIG. 1 in more detail.

FIG. 6 schematically illustrates the circuit of FIG. 1 in more detail. Similar reference numerals have been used for corresponding circuit elements.

Figure 7:
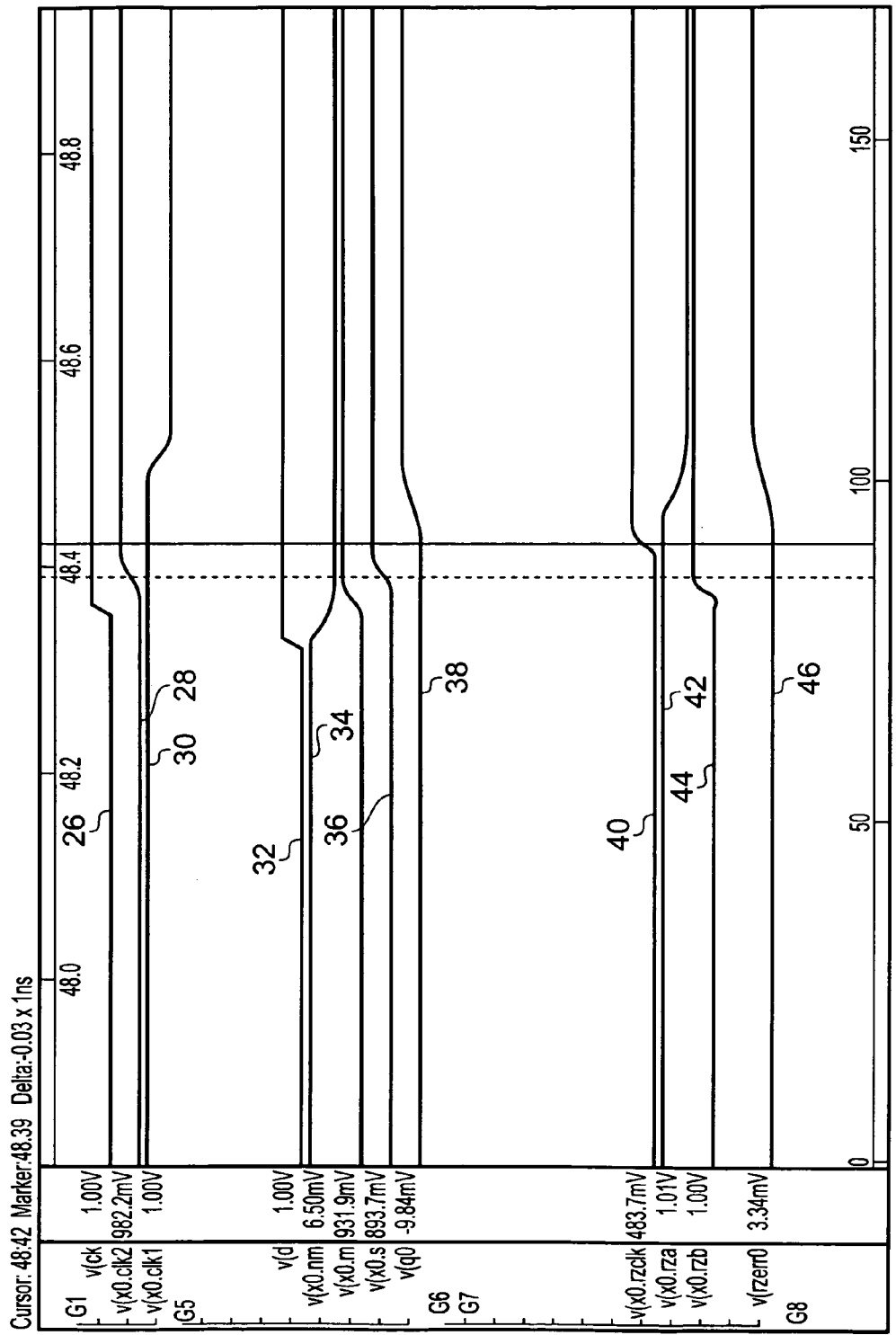
FIG. 7 shows a variety of signal waveforms arising during the operation of the circuit of FIG. 6.

FIG. 7 shows signal waveforms arising during the operating circuit of FIG. 6 when error detection has started (c.f. FIG. 4). First waveform 26 is the input clock signal to the delay circuitry 24. Second waveform 28 is the second clock signal clk2 which controls the transmission gate 10 and the third waveform 30 is the first clock signal clk1 which controls the tristate inverter 6.

The fourth waveform 32 is the input processing signal D supplied to the tristate inverter 6. The fifth waveform 34 represents the signal at the input node nm of the master storage circuitry 8. The sixth waveform 36 is the signal at the input to the slave storage circuitry 12 and the seventh waveform 38 is the output signal from the inverter 14.

The eight waveform 40 is the error detecting control signal rzclk. The ninth waveform 42 is the first intermediate signal rza and the tenth waveform 44 is the second intermediate signal rzb. The eleventh waveform 68 is the error signal rzerr output from the set stroke reset latch 20.

Figure 8:
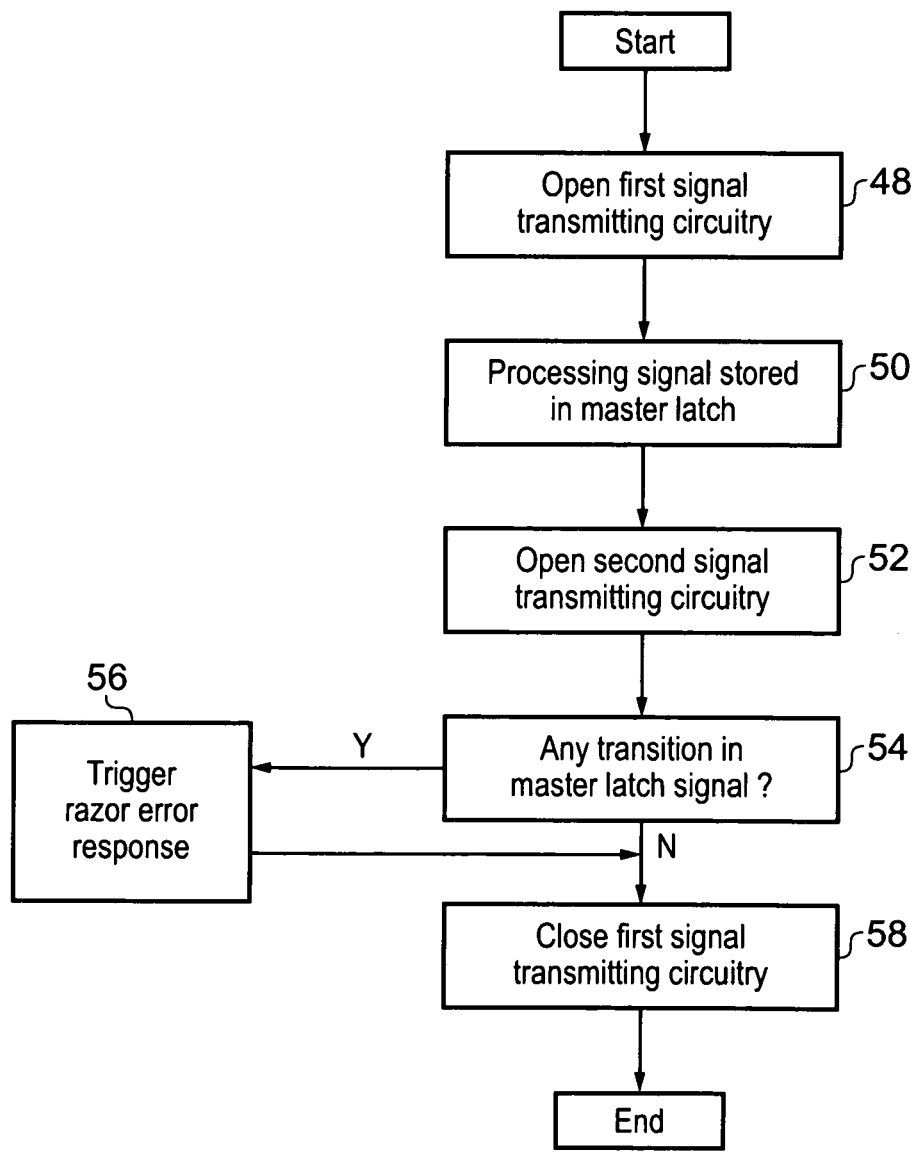
FIG. 8 is a flow diagram schematically illustrating the operation of the circuit of FIG. 1.

FIG. 8 is a flow diagram schematically illustrating the operation of the circuit of FIG. 1. At step 48 the first signal transmission circuitry in the form of the tristate inverter 6 is opened. At step 50 the processing signal is stored within the master storage circuitry 8. At step 52 the second signal transmitting circuitry in the form of the transmission gate 10 is opened. Step 54 determines whether or not any transition in the master latch signal nm is detected during the error detecting period. If an error is detected, then step 56 serves to trigger an error response by the error correcting circuitry 22. At step 58 the first signal transmitting circuitry is closed.

Figure 9:
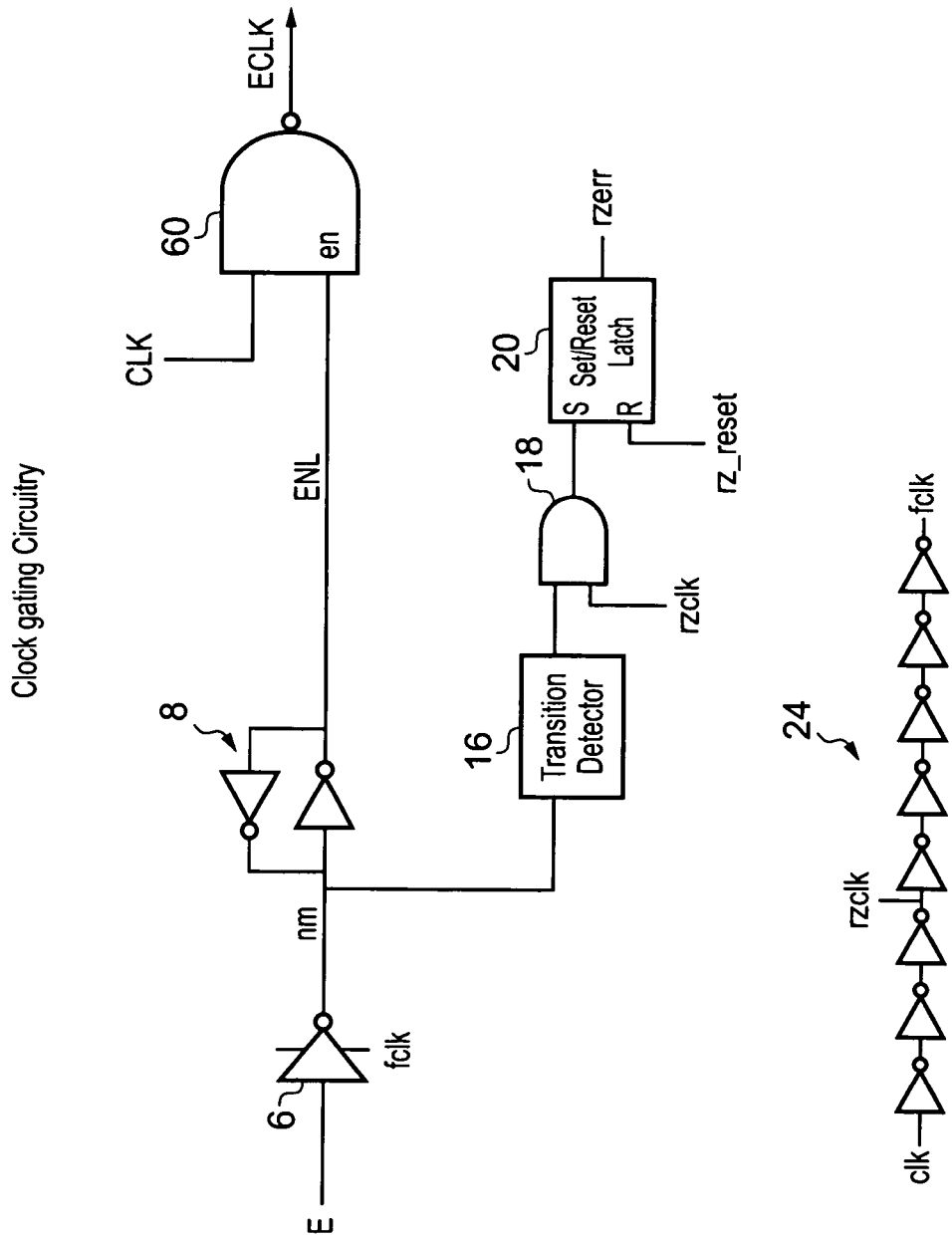
FIG. 9 schematically illustrates clock gating circuitry utilising one example of the present techniques.

FIG. 9 schematically illustrates another form of signal value saving circuitry. In this example the signal value saving circuitry is clock gating circuitry which serves to capture and store a clock enable signal E within storage circuitry 8 and then use this to control a logic gate 60, which serves as the second signal transmission circuitry, to generate an enabled clock signal eclk from a logical combination of the second clock signal clk and the processing signal (enable signal). A tristate inverter 6 controlled by a first clock signal clk1 serves to selectively pass the enable signal E to an input node nm of the storage circuitry 8. The output of the storage circuitry 8 provides a latched enable signal ENL to one input of an NAND gate 60 with the other input to the NAND gate 60 being the second clock signal CLK. The output of the NAND gate 60 is the enabled clock signal ECLK.

A transition detector 16 receives the enable signal E at the input node nm of the storage circuitry 8 and asserts a transition signal when any transition is detected in this enable signal. An AND gate 18 which receives a error detecting control signal rzclk from the delay circuitry 24 serves selectively to pass such a transition signal to be stored within a set/reset latch 20 during a period whose start is controlled by the error detecting control signal rzclk and whose end is controlled by the first clock signal clk1.

Figure 10:
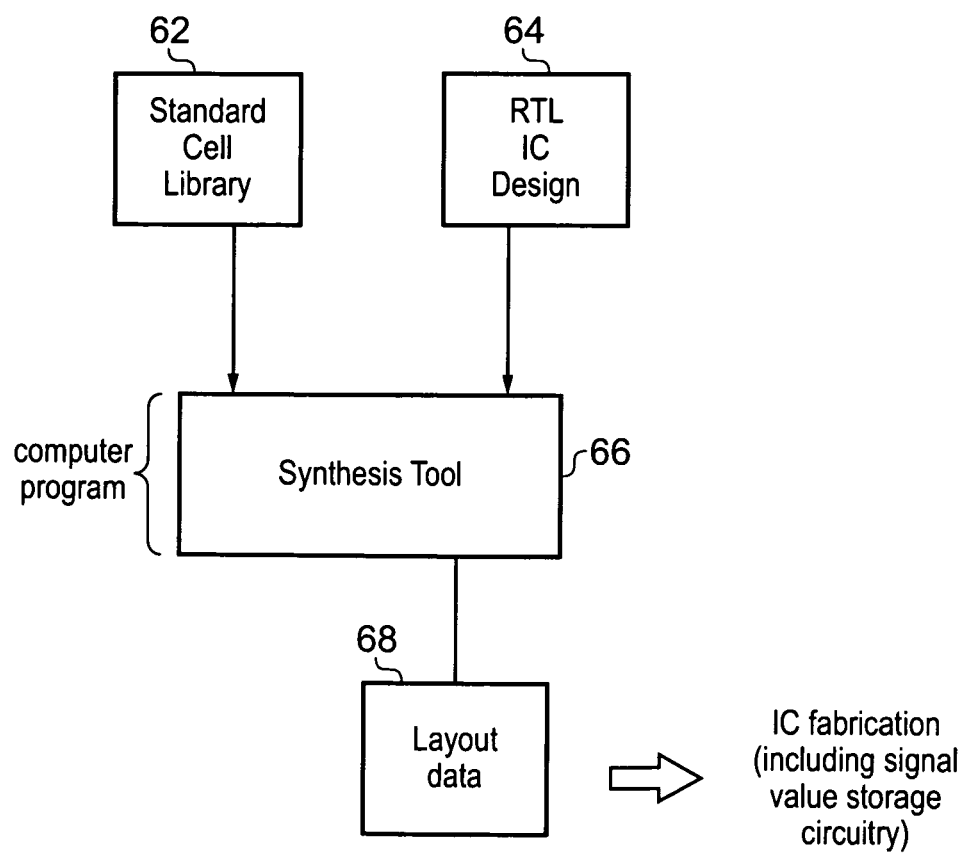
FIG. 10 schematically illustrates the use of a standard cell library to produce an integrated circuit incorporating signal value storage circuitry in accordance with the present techniques.

FIG. 10 schematically illustrates the design flow of an integrated circuit as part of ultimately manufacturing those integrated circuits. A standard cell library 62 incorporates data defining a plurality of standard cells each forming a building block which may be used to produce the full integrated circuit. RTL data 64 defines in register transfer language an integrated circuit design to be produced. A synthesis tool 66 executed as a computer program upon a general purpose control interprets the RTL integrated circuit design 64 and then utilises standard cells selected from the standard cell library 62 to form layout data 68. This layout data may be in the form of data defining masks that are used to manufacture the desired integrated circuit during a fabrication process. The standard cell library 62 may include many standard cells, such as AND gates, OR gates, latches and signal value storage circuits of the forms described above.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Signal value storage circuitry comprising:
   first signal transmission circuitry having a first processing signal input, a first processing signal output and a first clock signal input, said first signal transmission circuitry being configured to transmit a processing signal received at said first processing signal input to said first processing signal output when a first clock signal received at said first clock signal input has a first open value and to block transmission of said processing signal received at said first processing signal input to said first processing signal output when said first clock signal has a first closed value;
   storage circuitry having a storage input and a storage output, said storage input being connected to said first processing signal output and said storage circuitry being configured to capture said processing signal output from said first processing signal output, to store said processing signal when said storage input is not driven and to output said processing signal stored within said storage circuitry from said storage output;
   second signal transmission circuitry having a second processing signal input, a second processing signal output and a second clock signal input, said second processing signal input being connected to said storage output and said second signal transmission circuitry being configured to transmit said processing signal received at said second processing signal input to said second processing signal output when a second clock signal received at said second clock signal input has a second open value and to block transmission of said processing signal received at said second processing signal input to said second processing signal output when said second clock signal has a second closed value;

transition detector circuitry having a transition detector input connected to receive said processing signal from one of said storage input and said storage output, said transition detector circuitry being configured to assert an error signal if said processing signal from one of said storage input and said storage output changes during an error detection period.

2. Signal value storage circuitry as claimed in claim 1, wherein said error detection period starts at a time coordinated with said second clock signal changing from said second closed value to said second open value.

3. Signal value storage circuitry as claimed in claim 2, wherein said error detection period starts at a time with a predetermined offset from said second clock signal changing from said second closed value to said second open value.

4. Signal value storage circuitry as claimed in claim 1, wherein said error detection period ends at a time coordinated with said first clock signal changing from said first open value to said first closed value.

5. Signal value storage circuitry as claimed in claim 4, wherein said error detection period ends at a time when said first clock signal changes from said first open value to said first closed value.

6. Signal value storage circuitry as claimed in claim 1, comprising first delay circuitry configured to receive said second clock signal and to generate said first clock signal as a delayed form of said second clock signal.

7. Signal value storage circuitry as claimed in claim 6, wherein said first delay circuitry is configured to generate an error detection period control signal supplied to said transition detecting circuitry and indicating an end time of said error detection period as a delayed form of said second clock signal.

8. Signal value storage circuitry as claimed in claim 1, comprising second delay circuitry configured to receive said second clock signal and to generate a error detection period control signal supplied to said transition detecting circuitry and indicating an end time of said error detection period as a delayed form of said second clock signal.

9. Signal value storage circuitry as claimed in claim 1, wherein said first signal transmission circuitry comprises tristate inverter circuitry configured to have a high impedance blocking transmission of said processing signal when said first clock signal has said first closed value and a low impedance permitting transmission of said processing signal when said first clock signal has said first open value.

10. Signal value storage circuitry as claimed in claim 9, wherein said tristate inverter circuitry has a functional signal input, a scan signal input and a scan enable input and comprises:
a first tristate inverter configured to pass a functional signal received at said functional signal input to serve as said processing signal when said first clock signal has said first open value and a scan enable signal received at said scan enable input has a scan enabled closed value; and
a second tristate inverter configured to pass a scan signal received at said scan signal input to serve as said processing signal when said first clock signal has said first open value and said scan enable signal has a scan enabled open value.

11. Signal value storage circuitry as claimed in claim 1, wherein said signal value storage circuitry is master slave flip flop circuitry, said storage circuitry comprising a portion of master latch circuitry within said master slave flip flop circuitry and said master slave flip flop circuitry further comprising slave storage circuitry having a slave storage input and a slave storage output, said slave storage input being connected to said second processing signal output and said slave storage circuitry being configured to capture said processing signal output from said second processing signal output, to store said processing signal when said slave storage input is not driven and to output said processing signal stored within said slave storage circuitry from said slave storage output.

12. Signal value storage circuitry as claimed in claim 1, wherein said signal value storage circuitry is clock gating circuitry, said processing signal comprising an enable signal, and said storage circuitry comprising enable storage circuitry for storing said enable signal within said clock gating circuitry, said second signal transmission circuitry comprising a logic gate having a clock signal output, said logic gate being configured to generate an output clock signal at said clock signal output as a logical combination of said processing signal received at said second processing signal input and said second clock signal.

13. Signal value storage circuitry as claimed in claim 1, further comprising error correcting circuitry configured to respond to assertion of said error signal by said transition detector circuitry to initiate an error correction operation whereby processing based upon a value of said processing signal output from said second processing signal output before said detection of said change in said processing signal is suppressed.

14. Signal value storage circuitry as claimed in claim 1, wherein said transition detector input is connected to receive said processing signal from said storage input.

15. Signal value storage circuitry as claimed in claim 1, wherein said second transmission circuitry comprises a transmission gate configured to have a high impedance blocking transmission of said processing signal when said second clock signal has said second closed value and a low impedance permitting transmission of said processing signal when said second clock signal has said second open value.

16. Signal value storage circuitry as claimed in claim 1, wherein said transition detector circuitry comprises:
first edge detecting circuitry for logically combining said processing signal with a delayed version of said processing signal to generate a first intermediate signal with edges corresponding to a delayed rising edge of said processing signal and a falling edge of said processing signal;
second edge detecting circuitry for logically combining said processing signal with a delayed version of said processing signal to generate a second intermediate signal with edges corresponding to a rising edge of said processing signal and a delayed falling edge of said processing signal; and
combination circuitry configured to logically combine said first intermediate signal and said second intermediate signal to generate a transition signal with asserted portions corresponding to detected transitions in said processing circuitry.

17. A computer readable storage medium storing in non-transitory form standard cell library data for controlling a computer to form layout data for controlling manufacture of an integrated circuit including signal value storage circuitry as claimed in claim 1.

18. Signal value storage circuitry comprising:

first signal transmission means for transmitting a processing signal, said first signal transmission means having a first processing signal input, a first processing signal output and a first clock signal input, said first signal transmission means being configured to transmit said processing signal received at said first processing signal input to said first processing signal output when a first clock signal received at said first clock signal input has a first open value and to block transmission of said processing signal received at said first processing signal input to said first processing signal output when said first clock signal has a first closed value;

storage means for storing said processing signal, said storage means having a storage input and a storage output, said storage input being connected to said first processing signal output and said storage means being configured to capture said processing signal output from said first processing signal output, to store said processing signal when said storage input is not driven and to output said processing signal stored within said storage means from said storage output;

second signal transmission means for transmitting said processing signal, said second signal transmission means having a second processing signal input, a second processing signal output and a second clock signal input, said second processing signal input being connected to said storage output and said second signal transmission means being configured to transmit said processing signal received at said second processing signal input to said second processing signal output when a second clock signal received at said second clock signal input has a second open value and to block transmission of said processing signal received at said second processing signal input to said second processing signal output when said second clock signal has a second closed value;

transition detector means for detecting a transition in said processing signal, said transition detector means having a transition detector input connected to receive said processing signal from one of said storage input and said storage output, said transition detector means being configured to assert an error signal if said processing signal from one of said storage input and said storage output changes during an error detection period.

19. A method of operating signal value storage circuitry, said method comprising the steps of:

a first transmission control step of transmitting a processing signal through first signal transmitting circuitry having a first processing signal input, a first processing signal output and a first clock signal input, said first transmission control step transmitting said processing signal received at said first processing signal input to said first processing signal output when a first clock signal received at said first clock signal input has a first open value and blocking transmission of said processing signal received at said first processing signal input to said first processing signal output when said first clock signal has a first closed value;

a storing step of storing said processing signal in storage circuitry, said storage circuitry having a storage input and a storage output, said storage input being connected to said first processing signal output and said storing step capturing said processing signal output from said first processing signal output, storing said processing signal when said storage input is not driven and outputting said processing signal stored within said storage circuitry from said storage output;

a second signal transmission control step of transmitting said processing signal through second signal transmitting circuitry having a second processing signal input, a second processing signal output and a second clock signal input, said second processing signal input being connected to said storage output, said second signal transmission control step transmitting said processing signal received at said second processing signal input to said second processing signal output when a second clock signal received at said second clock signal input has a second open value and blocking transmission of said processing signal received at said second processing signal input to said second processing signal output when said second clock signal has a second closed value;

a transition detecting step of detecting a transition in said processing signal using transition detector circuitry having a transition detector input connected to receive said processing signal from one of said storage input and said storage output, said transition detecting steps asserting an error signal if said processing signal from one of said storage input and said storage output changes during an error detection period.

20. A method as claimed in claim 19, comprising an error correcting step of responding to assertion of said error signal by said transition detector circuitry by initiating an error correction operation whereby processing based upon a value of said processing signal output from said second processing signal output before said detection of said change in said processing signal is suppressed.

* * * * *